United States Patent
Jung

(10) Patent No.: US 7,754,592 B2
(45) Date of Patent: Jul. 13, 2010

(54) METHOD FOR FABRICATING SEMICONDUCTOR DEVICE

(75) Inventor: Jin-Ki Jung, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 200 days.

(21) Appl. No.: 11/824,352

(22) Filed: Jun. 29, 2007

(65) Prior Publication Data

US 2008/0166876 A1 Jul. 10, 2008

(30) Foreign Application Priority Data

Jan. 4, 2007 (KR) ...................... 10-2007-0001061

(51) Int. Cl.
*H01L 21/3205* (2006.01)
(52) U.S. Cl. ...................... 438/585; 438/717; 438/942; 257/E21.311; 257/E21.638
(58) Field of Classification Search ......... 438/197–199, 438/710, 717, 736, 739, 942, 943, 585, 587; 257/E21.311, E21.314, E21.625, E21.635, 257/E21.638
See application file for complete search history.

(56) References Cited

U.S. PATENT DOCUMENTS

| | | | |
|---|---|---|---|
| 2004/0185623 A1 | 9/2004 | Su et al. | |
| 2004/0266076 A1* | 12/2004 | Doris et al. | 438/157 |
| 2005/0287809 A1* | 12/2005 | Lee et al. | 438/689 |
| 2008/0153298 A1* | 6/2008 | Hui et al. | 438/703 |
| 2008/0160738 A1* | 7/2008 | Cho | 438/585 |
| 2008/0233726 A1* | 9/2008 | Jun et al. | 438/585 |
| 2008/0233730 A1* | 9/2008 | Yu et al. | 438/596 |

FOREIGN PATENT DOCUMENTS

| | | |
|---|---|---|
| CN | 1591838 A | 3/2005 |
| KR | 2005-0070320 | 7/2005 |
| KR | 10-0618907 B1 | 8/2006 |

* cited by examiner

*Primary Examiner*—Ha Tran T Nguyen
*Assistant Examiner*—Daniel Whalen
(74) *Attorney, Agent, or Firm*—Blakely, Sokoloff, Taylor & Zafman LLP

(57) ABSTRACT

A method for fabricating a semiconductor device includes forming an etch target layer over a substrate including a cell region and a peripheral region, forming a first mask pattern having a first portion and a second portion over the etch target layer in the cell region and forming a second mask pattern having a first portion and a second portion over the etch target layer in the peripheral region, forming a photoresist pattern over the cell region, trimming the first portion of the second mask pattern, removing the photoresist pattern and the second portion of the first mask pattern and the second portion of the second mask pattern, and etching the etch target layer to form a pattern in the cell region and a pattern in the peripheral region.

9 Claims, 13 Drawing Sheets

US 7,754,592 B2

METHOD FOR FABRICATING SEMICONDUCTOR DEVICE

CROSS-REFERENCE TO RELATED APPLICATIONS

The present invention claims priority of Korean patent application number 10-2007-0001061, filed on Jan. 4, 2007, which is incorporated by reference in its entirety.

BACKGROUND OF THE INVENTION

The present invention relates to a method for fabricating a semiconductor device, and more particularly, to a method for forming a pattern in a semiconductor device.

When forming a gate pattern in a dynamic random access memory (DRAM), it is often required to further reduce a critical dimension (CD) of a peripheral region to form a high-speed device.

FIGS. 1A and 1B illustrate cross-sectional views of a typical method for forming a semiconductor device.

Referring to FIG. 1A, a polysilicon layer 102 and a nitride-based layer 103 for forming a gate hard mask are formed over a substrate 101 including a cell region and a peripheral region. Photoresist patterns 104A and 104B are formed over the nitride-based layer 103. The photoresist pattern 104A is formed in the cell region and the photoresist pattern 104B is formed in the peripheral region, exposing pattern regions. Hereinafter, the photoresist pattern 104A in the cell region is referred to as the first photoresist pattern 104A and the photoresist pattern 104B in the peripheral region is referred to as the second photoresist pattern 104B.

Referring to FIG. 1B, the nitride-based layer 103 is etched. Reference numerals 103A and 103B refer to a first etched nitride-based layer 103A remaining in the cell region and a second etched nitride-based layer 103B remaining in the peripheral region, respectively. In the typical method, gate patterns are formed by forming the first and second photoresist patterns 104A and 104B exposing the pattern regions in the cell region and the peripheral region and performing the etch process using the first and second photoresist patterns 104A and 104B.

In the typical method, the first etched nitride-based layer 103A obtains a vertical profile. In contrast, the second etched nitride-based layer 103B obtains a sloped profile as represented with reference denotation 'S', causing an enlarged CD of the gate pattern in the peripheral region. The sloped profile is formed because a difference exists in pattern densities between the cell region and the peripheral region, and a loading effect is generated in the peripheral region where a spacing distance is large between patterns, causing polymers generated while etching the nitride-based layer 103 to accumulate on sidewalls of the second etched nitride-based layer 103B.

CD targets in the cell region and the peripheral region may not both be satisfied because the gate patterns are formed by performing one mask process on the cell region and the peripheral region. Also, it may be difficult to reduce the size below a certain level due to diverse pattern forms in the peripheral region.

SUMMARY OF THE INVENTION

Embodiments of the present invention are directed to provide a method for fabricating a semiconductor device, which can control critical dimensions of a cell region and a peripheral region.

In accordance with an aspect of the present invention, there is provided a method for fabricating a semiconductor device, including: forming an etch target layer over a substrate including a cell region and a peripheral region; forming a first mask pattern having a first portion and a second portion over the etch target layer in the cell region and forming a second mask pattern having a first portion and a second portion over the etch target layer in the peripheral region; forming a photoresist pattern over the cell region; trimming the first portion of the second mask pattern; removing the photoresist pattern and the second portion of the first mask pattern and the second portion of the second mask pattern; and etching the etch target layer to form a pattern in the cell region and a pattern in the peripheral region.

In accordance with another aspect of the present invention, there is provided a method for fabricating a semiconductor device, including: forming an N-type polysilicon layer and a P-type polysilicon layer over a substrate including an N-channel metal-oxide semiconductor (NMOS) region and a P-channel metal-oxide semiconductor (PMOS) region, the N-type polysilicon layer formed in the NMOS region and the P-type polysilicon layer formed in the PMOS region; forming a metal electrode layer over the N-type and P-type polysilicon layers; forming a gate hard mask pattern over the metal electrode layer; forming a photoresist pattern exposing the PMOS region; trimming the gate hard mask pattern in the PMOS region; removing the photoresist pattern; and etching the metal electrode layer and the N-type and P-type polysilicon layers to form gate patterns using the gate hard mask pattern.

In accordance with still another aspect of the present invention, there is provided a method for fabricating a semiconductor device, including: forming an N-type polysilicon layer and a P-type polysilicon layer over a substrate including an N-channel metal-oxide semiconductor (NMOS) region and a P-channel metal-oxide semiconductor (PMOS) region, the N-type polysilicon layer formed in the NMOS region and the P-type polysilicon layer formed in the PMOS region; forming a metal electrode layer over the N-type and P-type polysilicon layers; forming a gate hard mask over the metal electrode; forming a patterned buffer layer for defining gate pattern regions over the gate hard mask; forming a photoresist pattern exposing the PMOS region; trimming the patterned buffer layer in the PMOS region; removing the photoresist pattern; and etching the metal electrode layer and the N-type and P-type polysilicon layers to form gate patterns using the patterned buffer layer.

DESCRIPTION OF SPECIFIC EMBODIMENTS

Embodiments of the present invention relate to a method for fabricating a semiconductor device. According to embodiments of present invention, critical dimensions (CD) of a cell region and a peripheral region may be controlled by additionally performing a simple mask process. According to other embodiments of the present invention, a CD of a P-channel metal-oxide semiconductor (PMOS) region may be controlled by additionally performing a simple mask process.

FIGS. 2A to 2E illustrate cross-sectional views of a method for fabricating a semiconductor device in accordance with a first embodiment of the present invention.

Figure 1A:
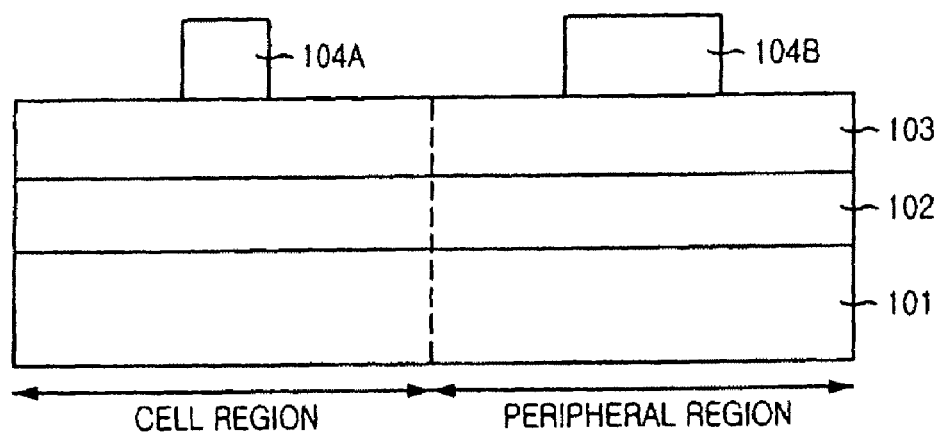
FIGS. 1A and 1B illustrate cross-sectional views of a typical method for fabricating a semiconductor device.
Figure 1B:
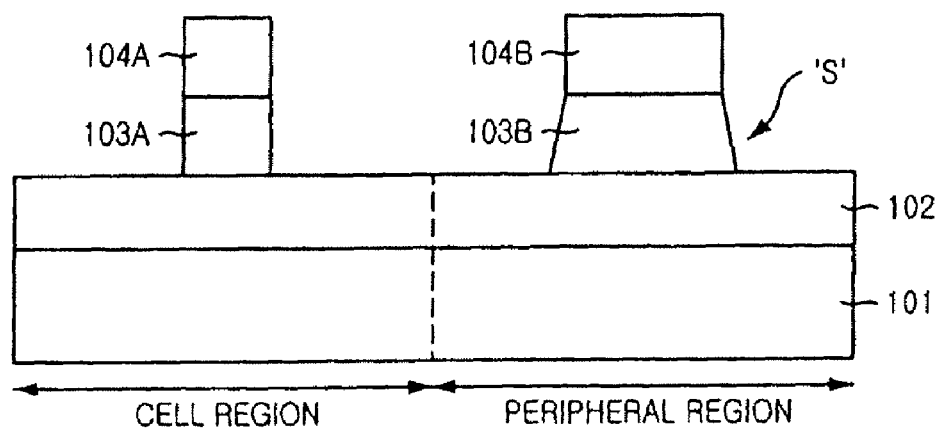
Figure 2A:
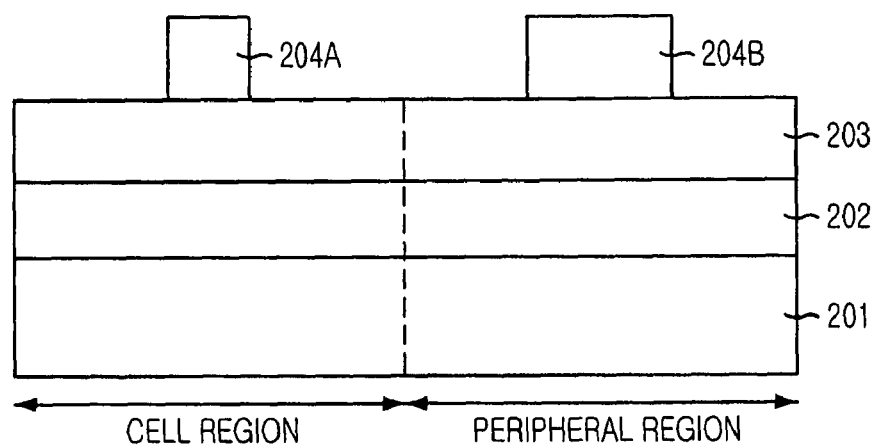
FIGS. 2A to 2E illustrate cross-sectional views of a method for fabricating a semiconductor device in accordance with a first embodiment of the present invention.

Referring to FIG. 2A, an etch target layer 202 is formed over a substrate 201 including a cell region and a peripheral region. The substrate 201 may include a substrate on which a dynamic random access memory (DRAM) process is to be performed. The etch target layer 202 includes a conductive layer to be used as a gate electrode or a bit line electrode. The etch target layer 202 includes polysilicon, metal, or metal silicide. The metal may include tungsten, and the metal silicide may include tungsten silicide.

A hard mask 203 is formed over the etch target layer 202. The hard mask 203 includes a nitride-based layer. For instance, the hard mask 203 includes a silicon nitride layer.

Mask patterns 204A and 204B are formed over the hard mask 203. The mask pattern 204A is formed in the cell region and the mask pattern 204B is formed in the peripheral region. Hereinafter, the mask pattern 204A formed in the cell region is referred to as the first mask pattern 204A and the mask pattern 204B formed in the peripheral region is referred to as the second mask pattern 204B. The first and second mask patterns 204A and 204B are formed to define pattern regions in the cell region and the peripheral region. The first and second mask patterns 204A and 204B may include amorphous carbon. The first and second mask patterns 204A and 204B may be formed by: forming an amorphous carbon layer over the hard mask 203; forming a photoresist layer over the amorphous carbon layer; performing a photo-exposure and developing process to pattern and define the pattern regions; etching the amorphous carbon layer; and removing the patterned photoresist layer.

Figure 2B:
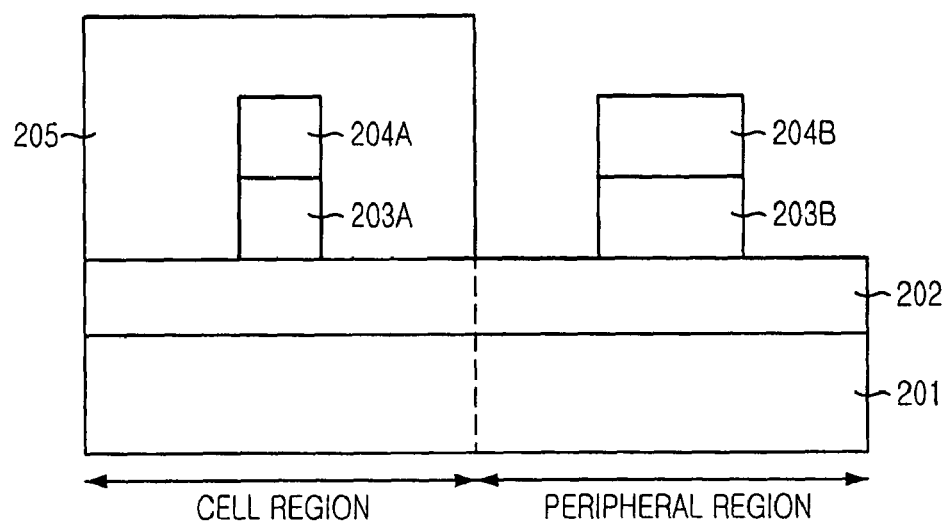

Referring to FIG. 2B, the hard mask 203 is etched. Reference numerals 203A and 203B refer to a first hard mask pattern 203A remaining in the cell region and a second hard mask pattern 203B remaining in the peripheral region, respectively. At this time, the second hard mask pattern 203B may have a width larger than a desired pattern width due to a loading effect.

A photoresist pattern 205 is formed over the cell region. The photoresist pattern 205 may be formed by forming a photoresist layer over the resultant structure, and performing a photo-exposure and developing process to pattern the photoresist layer such that the peripheral region is exposed.

Figure 2C:
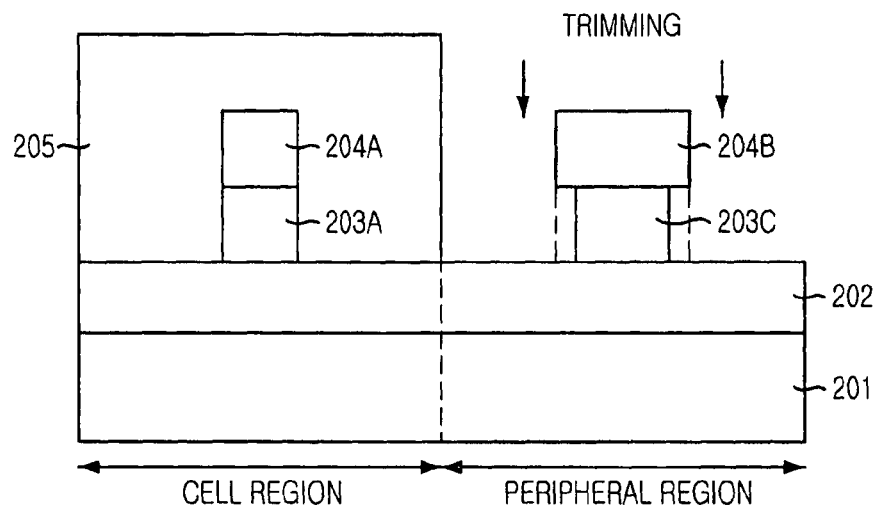

Referring to FIG. 2C, the second hard mask pattern 203B is trimmed. The trimming includes performing a plasma etch process. The plasma etch process is performed using a gas including tetrafluoromethane ($CF_4$), fluoroform ($CHF_3$), and oxygen ($O_2$).

Accordingly, the first hard mask pattern 203A is protected by the photoresist pattern 205, and the second hard mask pattern 203B is trimmed to reduce the width. Furthermore, the second mask pattern 204B formed over the second hard mask pattern 203B reduces damage on an upper portion of the second hard mask pattern 203B while trimming the second hard mask pattern 203B. Thus, a loss is decreased. Reference numeral 203C refers to a trimmed second hard mask 203C in the peripheral region.

Figure 2D:
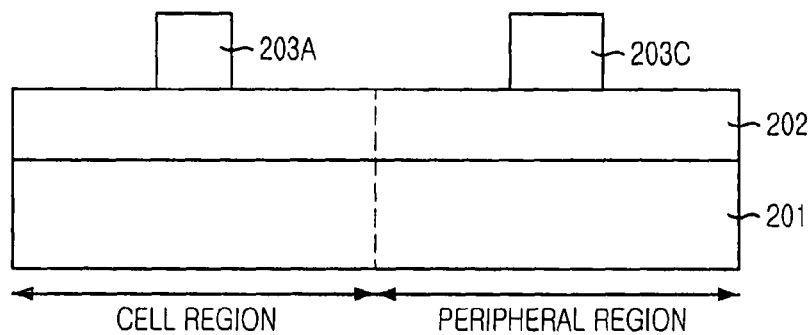

Referring to FIG. 2D, the photoresist pattern 205 and the first and second mask patterns 204A and 204B are removed. The photoresist pattern 205 and the first and second mask patterns 204A and 204B may be removed at substantially the same time using an oxygen removal process.

Figure 2E:
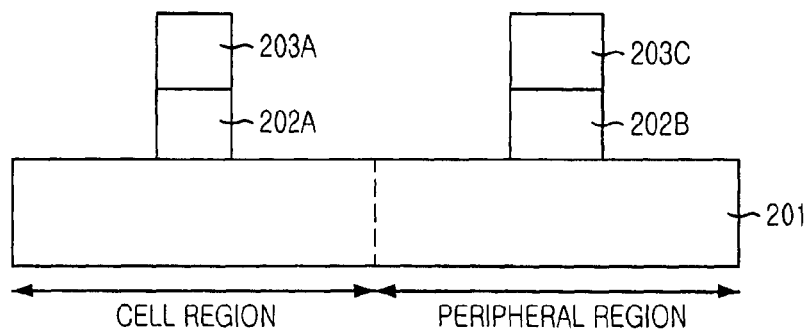

Referring to FIG. 2E, the etch target layer 202 is etched to form patterns. The pattern in the cell region includes a stack structure configured with a first etch target pattern 202A and the first hard mask pattern 203A. The pattern in the peripheral region includes a stack structure configured with a second etch target pattern 202B and the trimmed second hard mask 203C. The patterns include gate patterns or bit line patterns.

Accordingly, a CD between the cell region and the peripheral region may be controlled by trimming the second hard mask pattern 203B to reduce the CD, and the trimmed second hard mask 203C may not be formed to a width that is larger than a desired width, as shown in FIG. 2C.

The first embodiment of the present invention may also be applied to a P-type polysilicon layer in a PMOS region. Hereinafter, a method for fabricating a semiconductor device which can reduce a CD increase of a P-type polysilicon layer in a PMOS region is described in accordance with following embodiments.

FIGS. 3A to 3F illustrate cross-sectional views of a method for fabricating a semiconductor device in accordance with a second embodiment of the present invention.

Figure 3A:
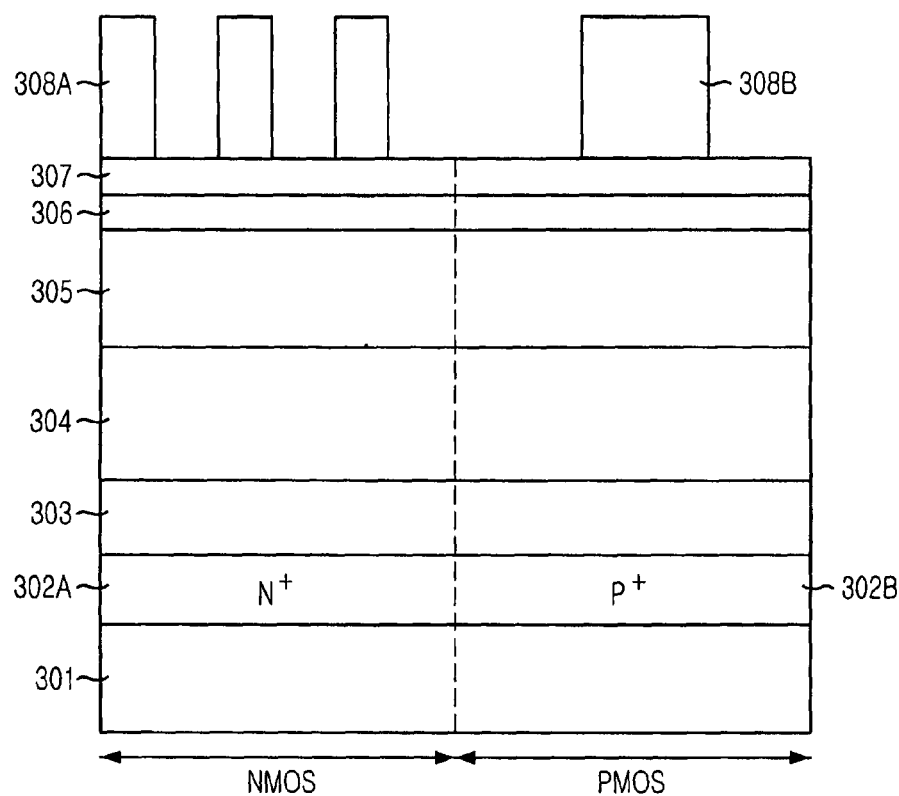
FIGS. 3A to 3F illustrate cross-sectional views of a method for fabricating a semiconductor device in accordance with a second embodiment of the present invention.

Referring to FIG. 3A, a substrate 301 including an N-channel metal-oxide semiconductor (NMOS) region and a PMOS region is provided. An N-type polysilicon layer 302A is formed in the NMOS region, and a P-type polysilicon layer 302B is formed in the PMOS region. The substrate 301 may include a substrate on which a DRAM process is to be performed. The NMOS region may be an NMOS region of a cell region and a peripheral region. In the embodiments of the present invention, a cell region is illustrated as the NMOS region.

The N-type polysilicon layer 302A and the P-type polysilicon layer 302B may each be formed by implanting N-type or P-type impurities in a polysilicon layer in the NMOS region and the PMOS region. Otherwise, the N-type polysilicon layer 302A and the P-type polysilicon layer 302B may be directly formed in the NMOS region and the PMOS region, respectively. The N-type impurities may include phosphorus (P) or arsenic (As), and the P-type impurities may include boron (B).

A metal electrode 303 and a gate hard mask 304 are formed over the N-type polysilicon layer 302A and the P-type polysilicon layer 302B. The metal electrode 303 may include a stack structure configured with a barrier metal and a metal layer. The metal layer may include tungsten. The gate hard mask 304 includes a nitride-based layer.

An amorphous carbon layer 305, a silicon oxynitride (SiON) layer 306, and a bottom anti-reflective coating (BARC) layer 307 are formed over the gate hard mask 304. The amorphous carbon layer 305 functions as a hard mask for etching the gate hard mask 304, the SiON layer 306 functions as a hard mask for etching the amorphous carbon layer 305, and the BARC layer 307 functions as an anti-reflective coating layer when forming subsequent first photoresist patterns.

First photoresist patterns 308A and 308B are formed over the BARC layer 307. The first photoresist patterns 308A and 308B define gate pattern regions. The first photoresist patterns 308A and 308B are formed by forming a photoresist layer over the BARC layer 307 and performing a photo-exposure and developing process to pattern and define the gate pattern regions. Hereinafter, the first photoresist pattern 308A formed in the NMOS region is referred to as the first NMOS photoresist pattern 308A, and the first photoresist pattern 308B formed in the PMOS region is referred to as the first PMOS photoresist pattern 308B for convenience of description. The first NMOS and PMOS photoresist patterns 308A and 308B are each formed to have a desired develop inspection critical dimension (DICD) in the NMOS region and the PMOS region.

Figure 3B:
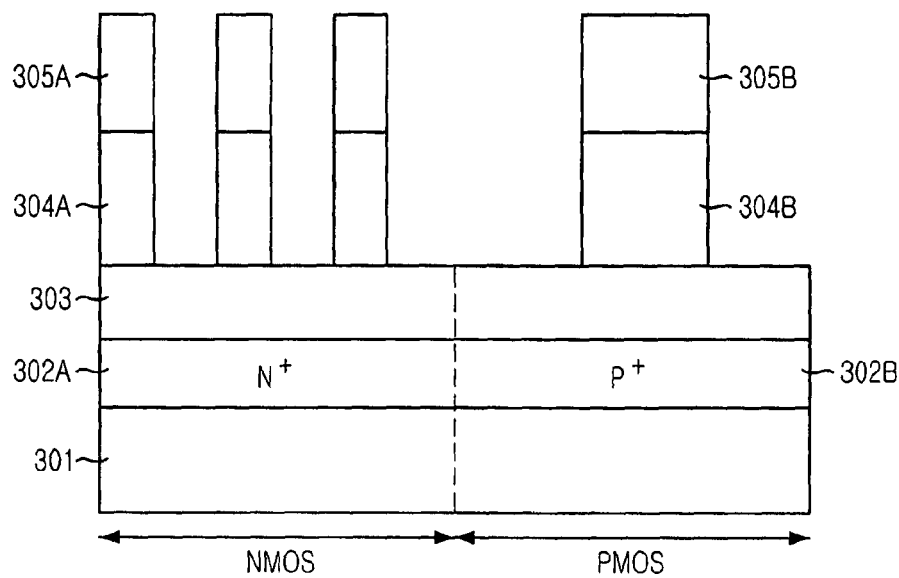

Referring to FIG. 3B, the BARC layer 307, the SiON layer 306, the amorphous carbon layer 305, and the gate hard mask 304 are etched. At this time, the first NMOS photoresist pattern 308A, the first PMOS photoresist pattern 308B, the BARC layer 307, and the SiON layer 306 are substantially removed by the time the gate hard mask 304 is etched. Thus, portions of the amorphous carbon layer 305 remain. Hereinafter, the portions of the amorphous carbon layer 305 remaining in the NMOS region are referred to as a first amorphous carbon pattern 305A, and the portion of the amorphous carbon layer 305 remaining in the PMOS region is referred to as a second amorphous carbon pattern 305B. Also, portions of the gate hard mask 304 remaining in the NMOS region are referred to as a first gate hard mask pattern 304A, and a portion of the gate hard mask 304 remaining in the PMOS region is referred to as a second gate hard mask pattern 304B hereinafter.

Figure 3C:
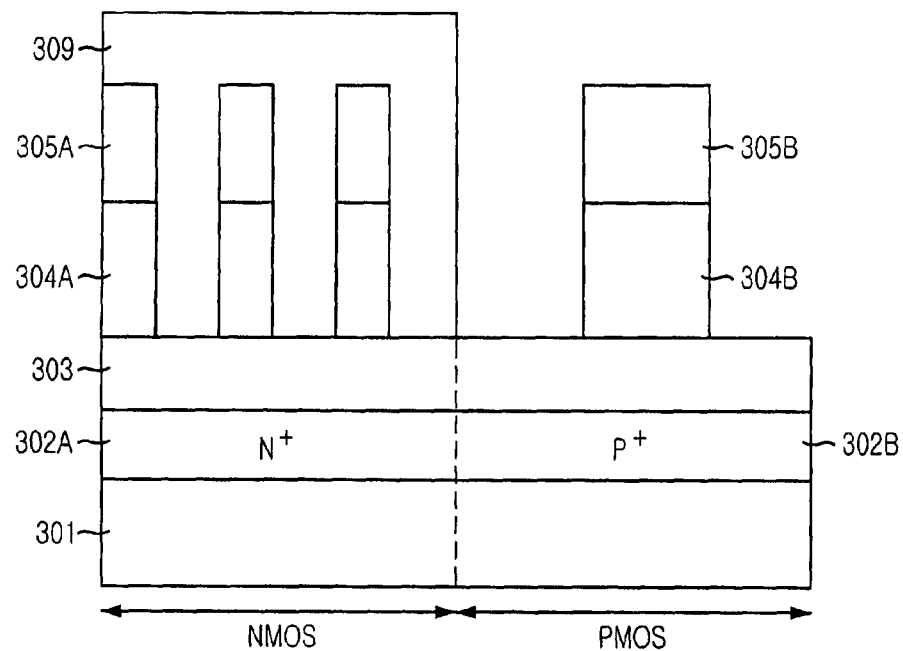

Referring to FIG. 3C, a second photoresist pattern 309 is formed. The second photoresist pattern 309 exposes the PMOS region. The second photoresist pattern 309 may be formed by forming a photoresist layer over the resultant structure, and performing a photo-exposure and developing process. The second photoresist pattern 309 may be formed by performing a patterning which is substantially the same as the one used to form masks exposing each of the NMOS and PMOS regions when forming the N-type polysilicon layer 302A and the P-type polysilicon layer 302B. Accordingly, the second photoresist pattern 309 exposes the PMOS region.

Figure 3D:
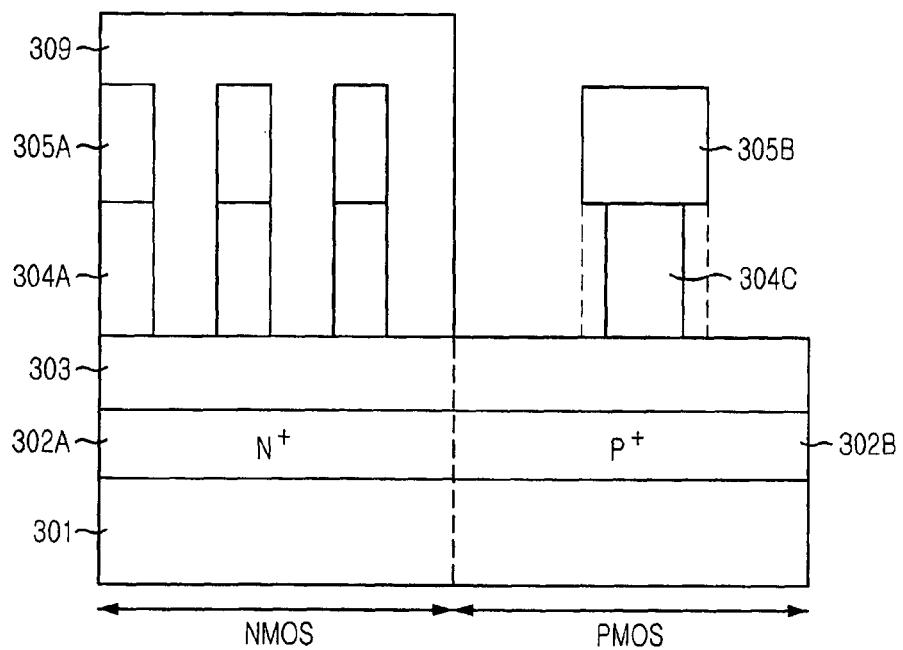

Referring to FIG. 3D, the second gate hard mask pattern 304B is trimmed. The trimming includes performing a plasma etch process using a gas including $CF_4$, $CHF_3$, and $O_2$.

At this time, a CD of the second gate hard mask pattern 304B decreases according to an etch time, and the metal electrode 303 is not damaged due to a selectivity. Also, the second amorphous carbon pattern 305B formed over the second gate hard mask pattern 304B protects an upper portion of the second gate hard mask pattern 304B during the trimming. Thus, a damage generated by the trimming may be decreased. Reference denotation 304C refers to a trimmed second gate hard mask 304C in the PMOS region.

Figure 3E:
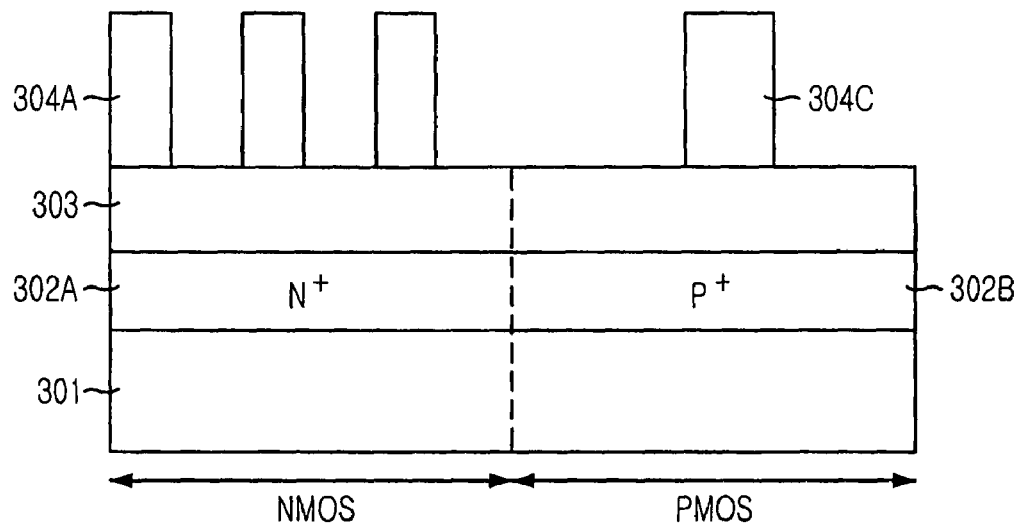

Referring to FIG. 3E, the second photoresist pattern 309 is removed. The second photoresist pattern 309 may be removed using oxygen plasma. The first and second amorphous carbon patterns 305A and 305B are also removed when the second photoresist pattern 309 is removed.

Figure 3F:
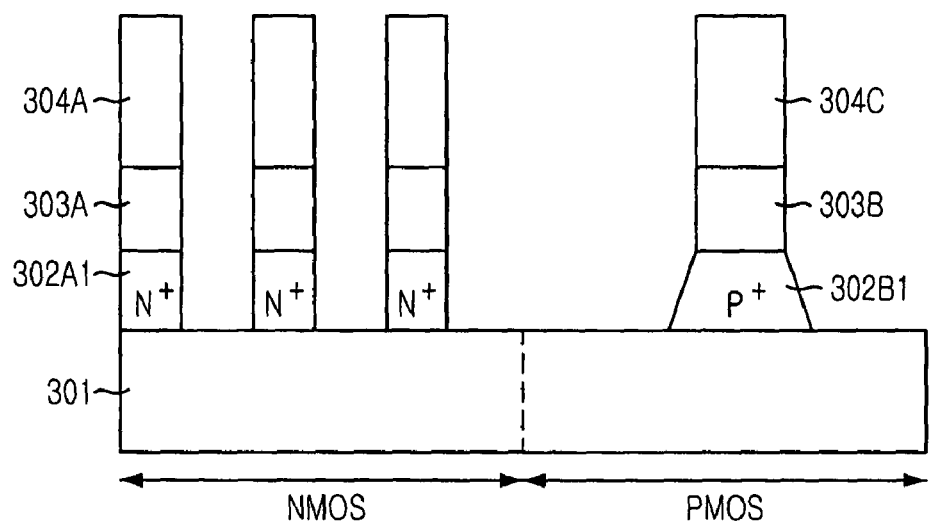

Referring to FIG. 3F, gate patterns are formed by etching the metal electrode 303, the N-type polysilicon layer 302A, and the P-type polysilicon layer 302B, using the first gate hard mask pattern 304A and the trimmed second gate hard mask 304C. Hereinafter, portions of the metal electrode 303 remaining in the NMOS region are referred to as a first metal electrode pattern 303A, and a portion of the metal electrode 303 remaining in the PMOS region is referred to as a second metal electrode pattern 303B. Reference numerals 302A1 and 302B1 refer to an N-type polysilicon pattern 302A1 and a P-type polysilicon pattern 302B1, respectively. Even if the P-type polysilicon pattern 302B1 is formed with a positive slope, a bias increase is not large because the CD is reduced by trimming the second gate hard mask pattern 304B as shown in FIG. 3D.

FIGS. 4A to 4F illustrate cross-sectional views of a method for fabricating a semiconductor device in accordance with a third embodiment of the present invention.

Figure 4A:
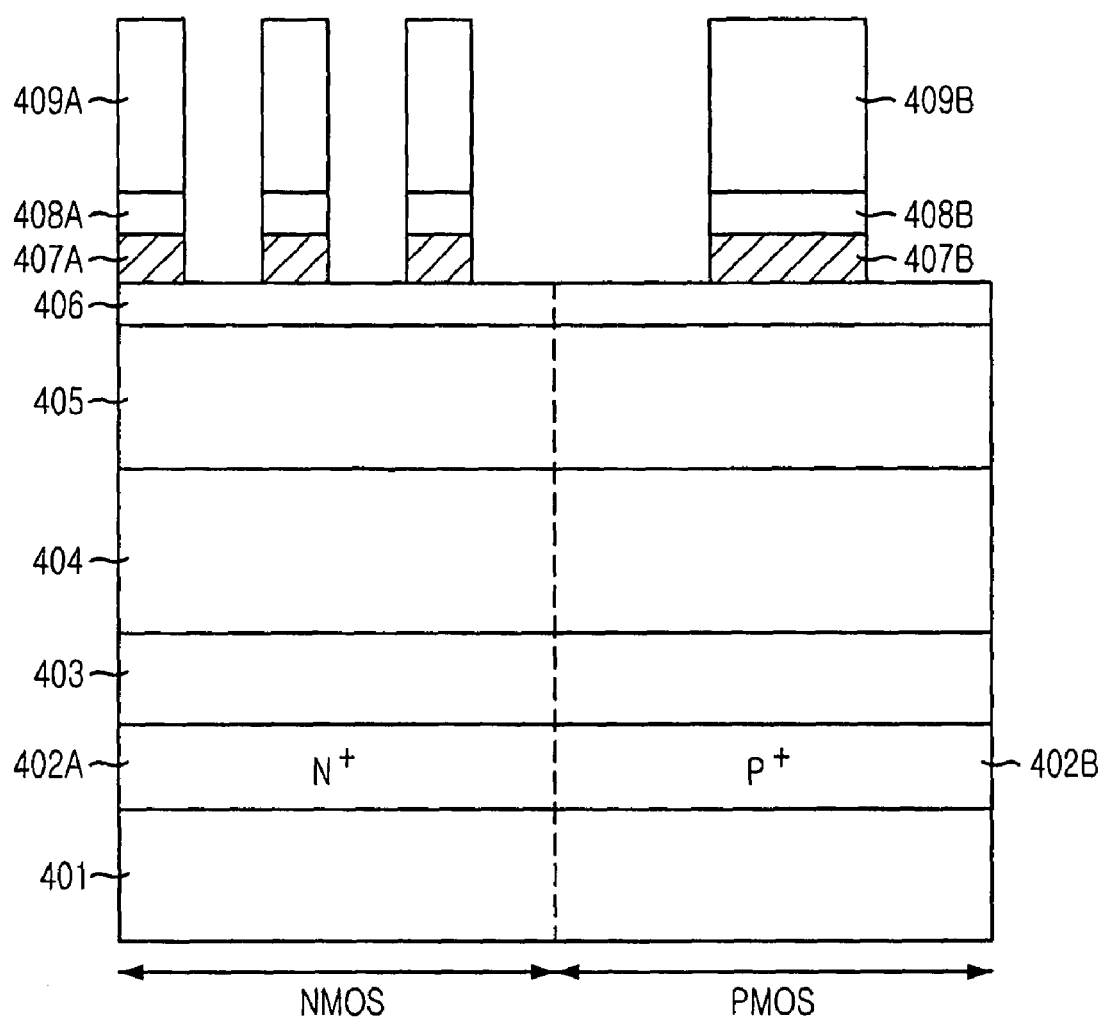
FIGS. 4A to 4F illustrate cross-sectional views of a method for fabricating a semiconductor device in accordance with a third embodiment of the present invention.

Referring to FIG. 4A, a substrate 401 including an NMOS region and a PMOS region is provided. An N-type polysilicon layer 402A is formed in the NMOS region, and a P-type polysilicon layer 402B is formed in the PMOS region. The substrate 401 may include a substrate on which a DRAM process is to be performed. The NMOS region may be an NMOS region of a cell region and a peripheral region. In the embodiments of the present invention, a cell region is illustrated as the NMOS region.

The N-type polysilicon layer 402A and the P-type polysilicon layer 402B may each be formed by implanting N-type or P-type impurities in a polysilicon layer in the NMOS region and the PMOS region. Otherwise, the N-type polysilicon layer 402A and the P-type polysilicon layer 402B may be directly formed in the NMOS region and the PMOS region, respectively. The N-type impurities may include P or As, and the P-type impurities may include B.

A metal electrode 403 and a gate hard mask 404 are formed over the N-type polysilicon layer 402A and the P-type polysilicon layer 402B. The metal electrode 403 may include a stack structure configured with a barrier metal and a metal layer. The metal layer may include tungsten. The gate hard mask 404 includes a nitride-based layer.

An amorphous carbon layer 405, a SiON layer 406, first and second patterned buffer layers 407A and 407B, and first and second BARC patterns 408A and 408B are formed over the gate hard mask 404. In more detail, a buffer layer and a BARC layer are formed over the SiON layer 406. The amorphous carbon layer 405 functions as a hard mask for etching the gate hard mask 404, the SiON layer 406 functions as a hard mask for etching the amorphous carbon layer 405, and the BARC layer functions as an anti-reflective coating layer when forming subsequent first photoresist patterns. The buffer layer is formed to reduce a CD of the PMOS region during initial processes. The buffer layer includes a material having a selectivity to the SiON layer 406. The buffer layer includes polysilicon, tungsten, or tungsten silicide.

First photoresist patterns 409A and 409B are formed over the BARC layer. The first photoresist patterns 409A and 409B define gate pattern regions. The first photoresist patterns 409A and 409B are formed by forming a photoresist layer over the BARC layer and performing a photo-exposure and developing process to pattern and define the gate pattern regions. Hereinafter, the first photoresist pattern 409A formed in the NMOS region is referred to as the first NMOS photoresist pattern 409A and the first photoresist pattern 409B formed in the PMOS region is referred to as the first PMOS photoresist pattern 409B for convenience of description. The first NMOS and PMOS photoresist patterns 409A and 409B are each formed to have a desired DICD in the NMOS region and the PMOS region.

The BARC layer and the buffer layer are etched to form the first and second patterned buffer layers 407A and 407B and the first and second BARC patterns 408A and 408B. The first patterned buffer layer 407A is formed in the NMOS region and the second patterned buffer layer 407B is formed in the PMOS region. Also, the first BARC pattern 408A is formed in the NMOS region and the second BARC pattern 408B is formed in the PMOS region. The BARC layer and the buffer layer may be etched using a plasma etch process.

Figure 4B:
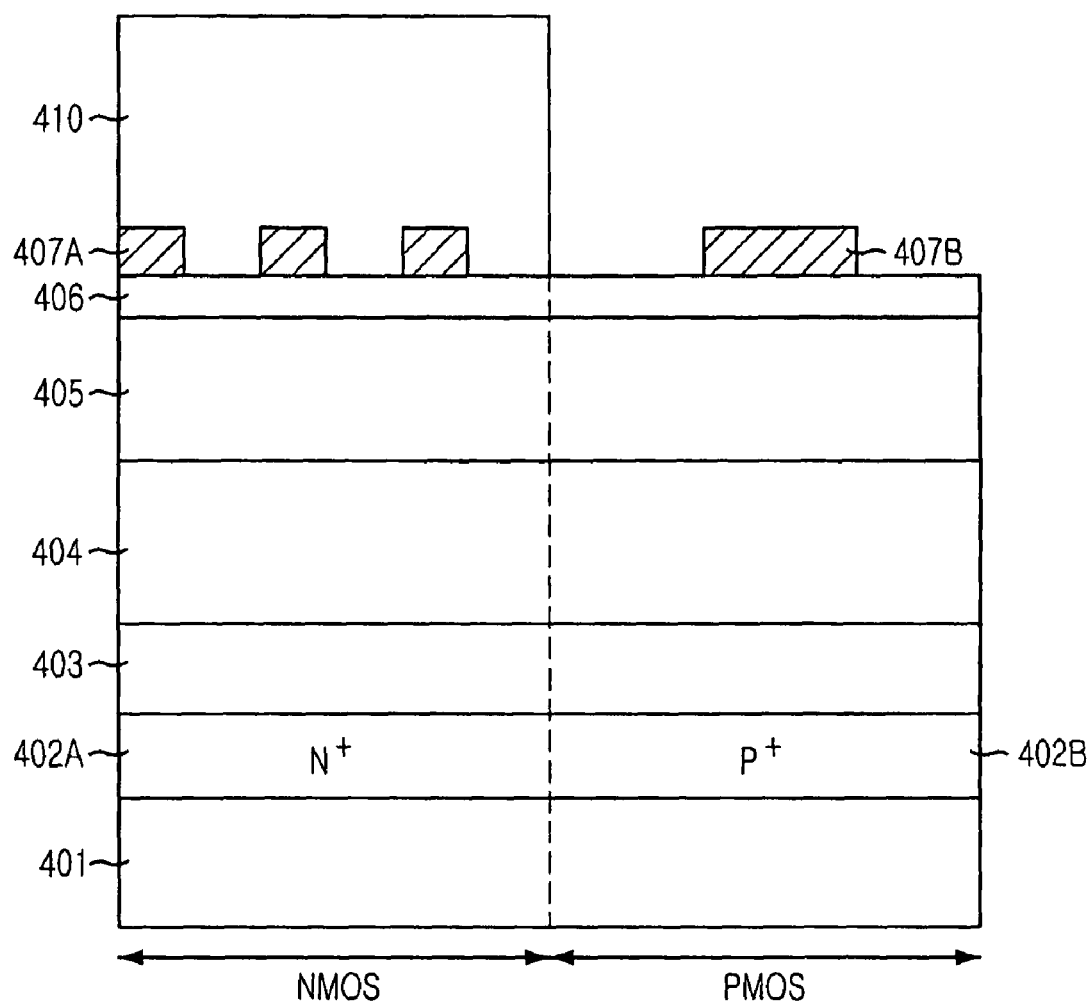

Referring to FIG. 4B, the first NMOS and PMOS photoresist patterns 409A and 409B and the first and second BARC patterns 408A and 408B are removed. The first NMOS and PMOS photoresist patterns 409A and 409B and the first and second BARC patterns 408A and 408B may be removed using oxygen plasma. A cleaning process is performed.

A second photoresist pattern 410 is formed. The second photoresist pattern 410 exposes the PMOS region. The second photoresist pattern 410 may be formed by forming a photoresist layer over the resultant structure and performing a photo-exposure and developing process. The second photoresist pattern 410 may be formed by performing a patterning which is substantially the same as the one used to form masks exposing each of the NMOS and PMOS regions when forming the N-type polysilicon layer 402A and the P-type polysilicon layer 402B. Accordingly, the second photoresist pattern 410 exposes the PMOS region.

Figure 4C:
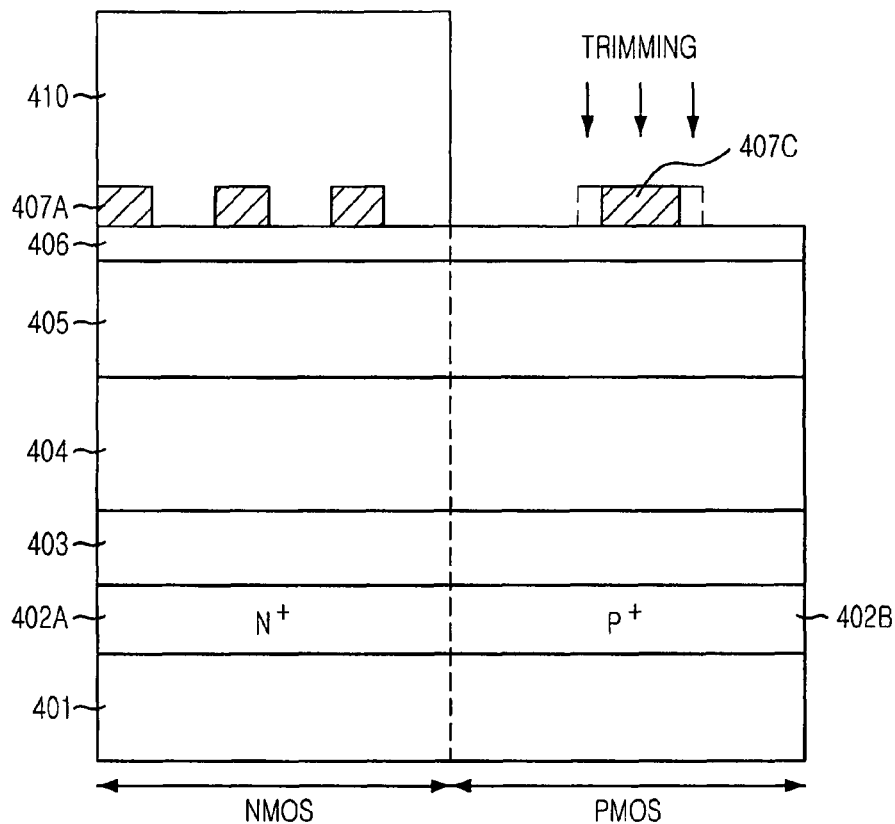

Referring to FIG. 4C, the second patterned buffer layer 407B is trimmed. The trimming may be performed using a different gas according to the material of the second patterned buffer layer 407B. That is, if the second patterned buffer layer 407B includes polysilicon, the trimming is performed using a gas including hydrogen bromide (HBr), chlorine ($Cl_2$) and $O_2$. If the second patterned buffer layer 407B includes tungsten or tungsten silicide, the trimming is performed using a gas including $Cl_2$, nitrogen ($N_2$), and one of nitrogen trifluoride ($NF_3$) and sulfur hexafluoride ($SF_6$).

A CD of the second patterned buffer layer 407B is reduced according to an etch time, and the SiON layer 406 is not damaged due to a selectivity. Reference numeral 407C refers to a trimmed second patterned buffer layer 407C in the PMOS region.

Figure 4D:
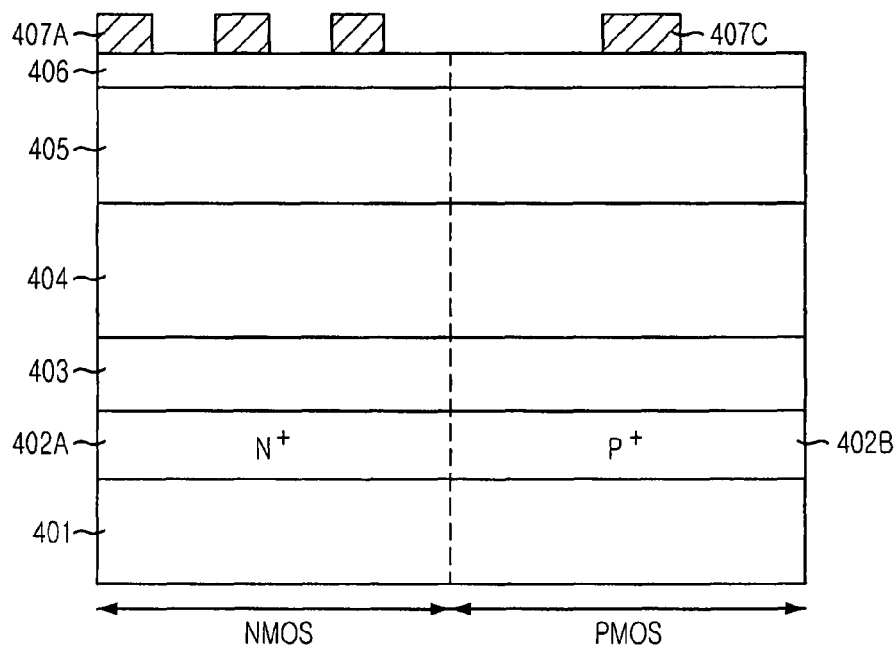

Referring to FIG. 4D, the second photoresist pattern 410 is removed. The second photoresist pattern 410 may be removed using oxygen plasma. A cleaning process is performed.

Figure 4E:
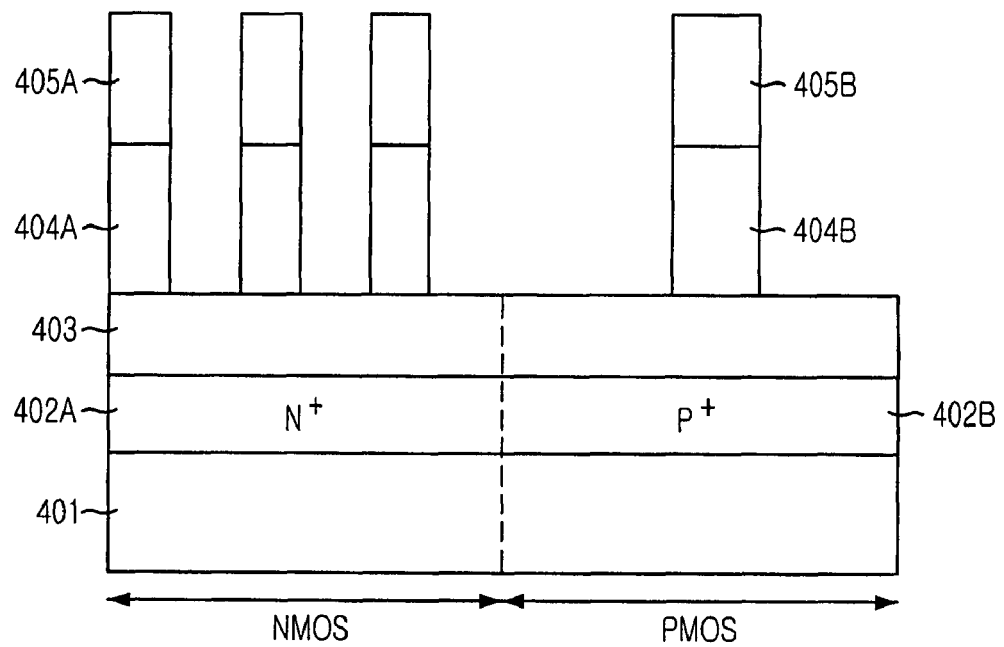

Referring to FIG. 4E, the SiON layer 406, the amorphous carbon layer 405, and the gate hard mask 404 are etched. The first patterned buffer layer 407A, the trimmed second patterned buffer layer 407C, and the SiON layer 406 are removed by the time the gate hard mask 404 is etched. Thus, portions of the amorphous carbon layer 405 remain. Hereinafter, the portions of the amorphous carbon layer 405 remaining in the NMOS region are referred to as a first amorphous carbon pattern 405A, and the portion of the amorphous carbon layer 405 remaining in the PMOS region is referred to as a second amorphous carbon pattern 405B. Also, portions of the gate hard mask 404 remaining in the NMOS region are referred to as a first gate hard mask pattern 404A, and a portion of the gate hard mask 404 remaining in the PMOS region is referred to as a second gate hard mask pattern 404B hereinafter.

Figure 4F:
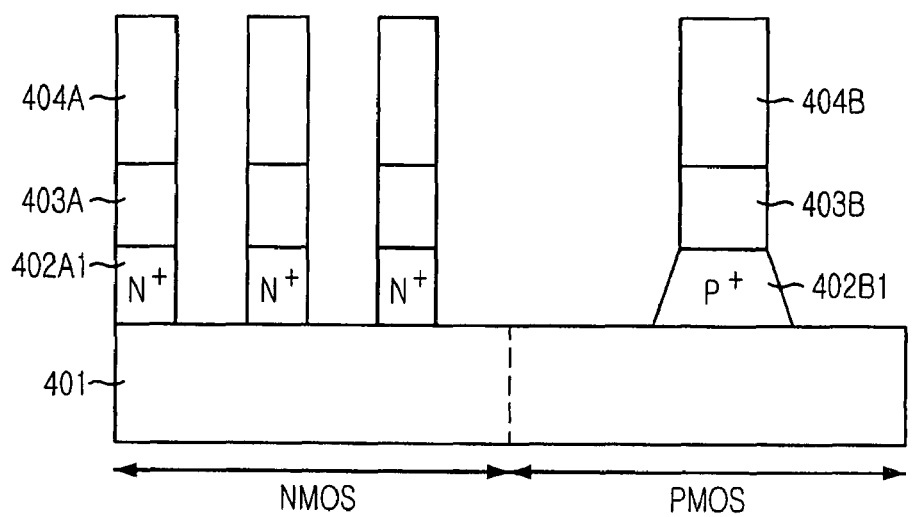

Referring to FIG. 4F, the first amorphous carbon pattern 405A and second amorphous carbon pattern 405B are removed. The first amorphous carbon pattern 405A and second amorphous carbon pattern 405B may be removed using oxygen plasma. A cleaning process is performed.

The metal electrode 403, the N-type polysilicon layer 402A, and the P-type polysilicon layer 402B are etched to form gate patterns. Portions of the metal electrode 403 remaining in the NMOS region are referred to as a first metal electrode pattern 403A, and a portion of the metal electrode 403 remaining in the PMOS region is referred to as a second metal electrode pattern 403B. Reference numerals 402A1 and 402B1 refer to an N-type polysilicon pattern 402A1 and a P-type polysilicon pattern 402B1, respectively. Even if the P-type polysilicon pattern 402B1 is formed with a positive slope, a bias increase is not large because the CD is reduced by trimming the second patterned buffer layer 407B as shown in FIG. 4C.

FIGS. 5A to 5F illustrate cross-sectional views of a method for fabricating a semiconductor device in accordance with a fourth embodiment of the present invention.

Figure 5A:
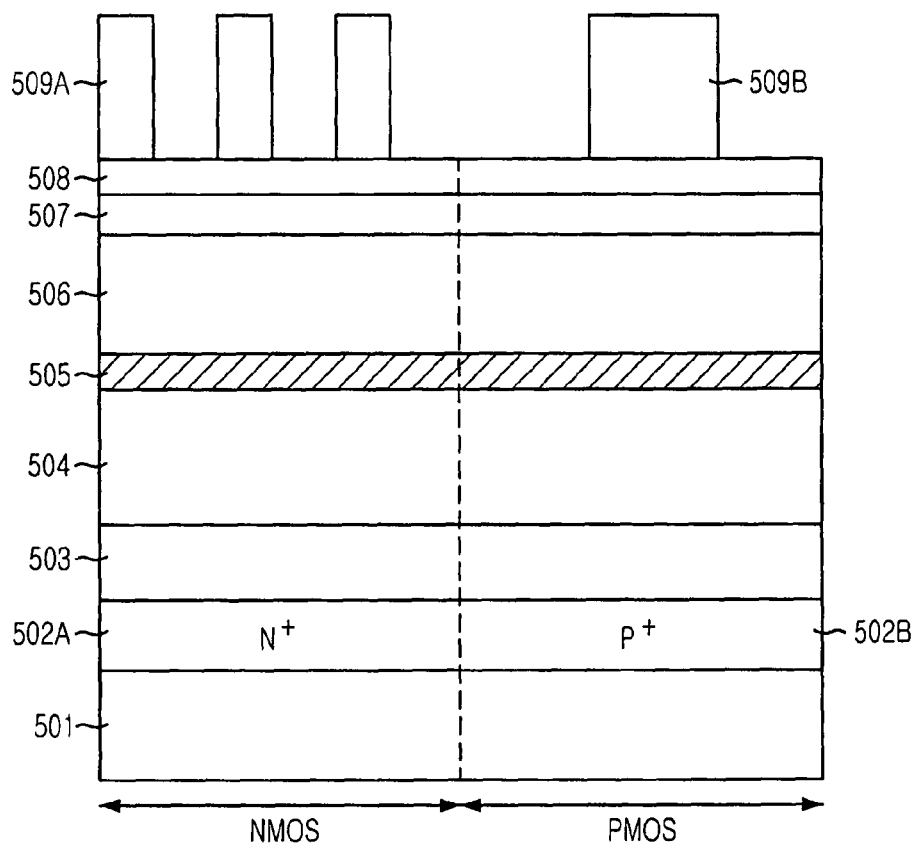
FIGS. 5A to 5F illustrate cross-sectional views of a method for fabricating a semiconductor device in accordance with a fourth embodiment of the present invention.

Referring to FIG. 5A, a substrate 501 including an NMOS region and a PMOS region is provided. An N-type polysilicon layer 502A is formed in the NMOS region, and a P-type polysilicon layer 502B is formed in the PMOS region. The substrate 501 may include a substrate on which a DRAM process is to be performed. The NMOS region may be an NMOS region of a cell region and a peripheral region. In the embodiments of the present invention, a cell region is illustrated as the NMOS region.

The N-type polysilicon layer 502A and the P-type polysilicon layer 502B may each be formed by implanting N-type or P-type impurities in a polysilicon layer in the NMOS region and the PMOS region. Otherwise, the N-type polysilicon layer 502A and the P-type polysilicon layer 502B may be directly formed in the NMOS region and the PMOS region, respectively. The N-type impurities may include P or As, and the P-type impurities may include B.

A metal electrode 503 and a gate hard mask 504 are formed over the N-type polysilicon layer 502A and the P-type polysilicon layer 502B. The metal electrode 503 may include a stack structure configured with a barrier metal and a metal layer. The metal layer may include tungsten. The gate hard mask 504 includes a nitride-based layer.

A buffer layer 505, an amorphous carbon layer 506, a SiON layer 507, and a BARC layer 508 are formed over the gate hard mask 504. The amorphous carbon layer 506 functions as a hard mask for etching the buffer layer 505, the SiON layer 507 functions as a hard mask for etching the amorphous carbon layer 506, and the BARC layer 508 functions as an anti-reflective coating layer when forming subsequent first photoresist patterns.

The buffer layer 505 is formed to reduce a CD of the PMOS region. Forming the buffer layer 505 may reduce a burden of directly trimming the gate hard mask 504. The buffer layer 505 includes a material having a selectivity to the gate hard mask 504. The buffer layer includes polysilicon, tungsten, or tungsten silicide.

First photoresist patterns 509A and 509B are formed over the BARC layer 508. The first photoresist patterns 509A and 509B define gate pattern regions. The first photoresist patterns 509A and 509B are formed by forming a photoresist layer over the BARC layer 508 and performing a photo-exposure and developing process to pattern and define the gate pattern regions. Hereinafter, the first photoresist pattern 509A formed in the NMOS region is referred to as the first NMOS photoresist pattern 509A and the first photoresist pattern 509B formed in the PMOS region is referred to as the first PMOS photoresist pattern 509B for convenience of description. The first NMOS and PMOS photoresist patterns 509A and 509B are each formed to have a desired DICD in the NMOS region and the PMOS region.

Figure 5B:
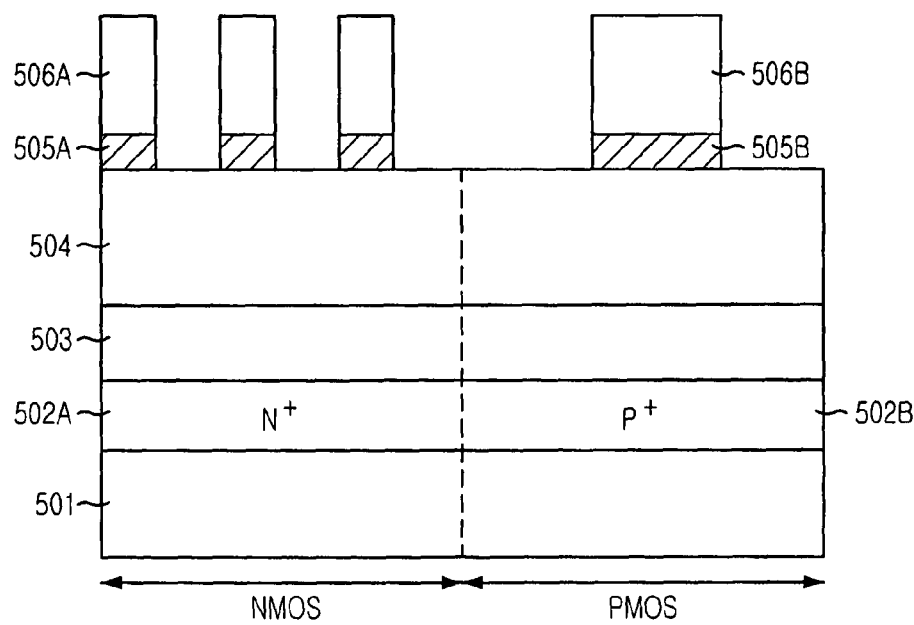

Referring to FIG. 5B, the BARC layer 508, the SiON layer 507, the amorphous carbon layer 506, and the buffer layer 505 are etched. At this time, the first NMOS photoresist pattern 509A, the first PMOS photoresist pattern 509B, the BARC layer 508, and the SiON layer 507 are substantially removed by the time the buffer layer 505 is etched. Thus, portions of the amorphous carbon layer 506 remain. Hereinafter, the portions of the amorphous carbon layer 506 remaining in the NMOS region are referred to as a first amorphous carbon pattern 506A, and the portion of the amorphous carbon layer 506 remaining in the PMOS region is referred to as a second amorphous carbon pattern 506B. Also, portions of the buffer layer 505 remaining in the NMOS region are referred to as a first buffer pattern 505A, and a portion of the buffer layer 505 remaining in the PMOS region is referred to as a second buffer pattern 505B hereinafter.

Figure 5C:
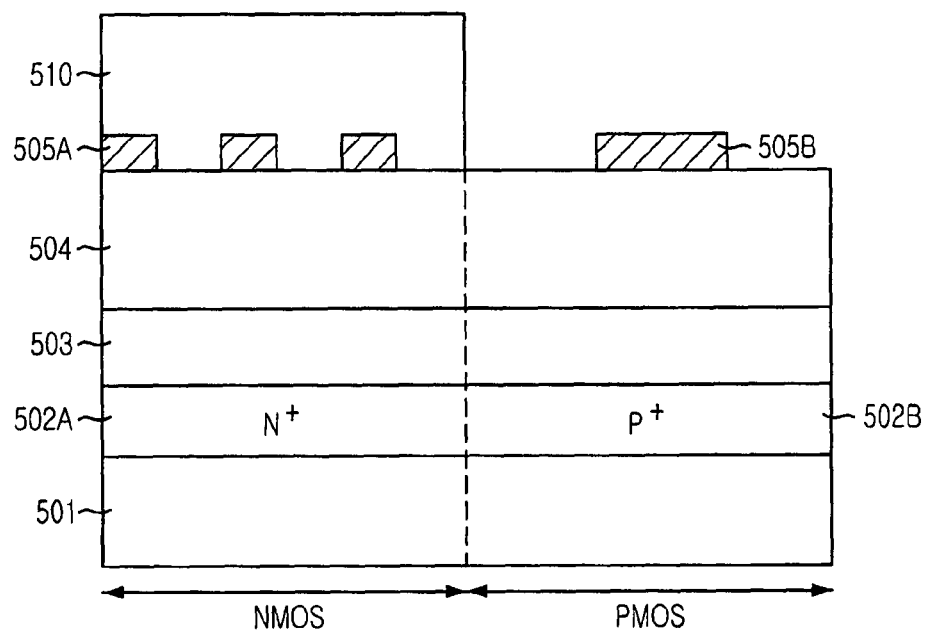

Referring to FIG. 5C, the first and second amorphous carbon patterns 506A and 506B are removed. The first and second amorphous carbon patterns 506A and 506B may be removed using oxygen plasma. A cleaning process is performed. A second photoresist pattern 510 is formed. The second photoresist pattern 510 exposes the PMOS region. The second photoresist pattern 510 may be formed by forming a photoresist layer over the resultant structure, and performing a photo-exposure and developing process. The second photoresist pattern 510 may be formed by performing a patterning which is substantially the same as the one used to form masks exposing each of the NMOS and PMOS regions when forming the N-type polysilicon layer 502A and the P-type polysilicon layer 502B. Accordingly, the second photoresist pattern 510 exposes the PMOS region.

Figure 5D:
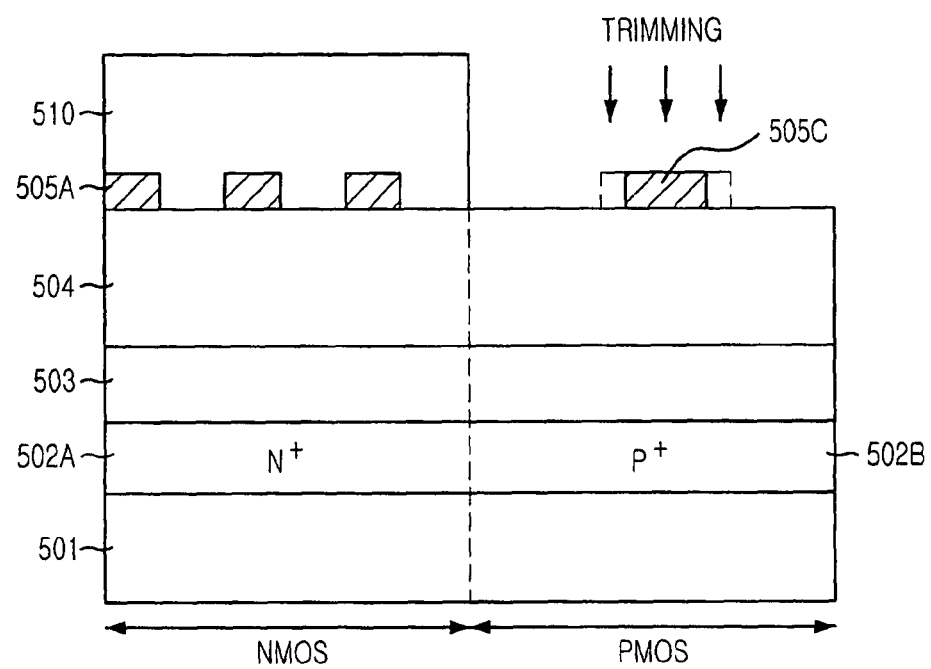

Referring to FIG. 5D, the second buffer pattern 505B is trimmed. The trimming may be performed using a different gas according to the material of the second buffer pattern 505B. That is, if the second buffer pattern 505B includes polysilicon, the trimming is performed using a gas including HBr, $Cl_2$ and $O_2$. If the second buffer pattern 505B includes tungsten or tungsten silicide, the trimming is performed using a gas including $Cl_2$, $N_2$, and one of $NF_3$ and $SF_6$.

A CD of the second buffer pattern 505B is reduced according to an etch time, and the gate hard mask 504 is not damaged due to a selectivity. Reference numeral 505C refers to a trimmed second buffer pattern 505C in the PMOS region.

Figure 5E:
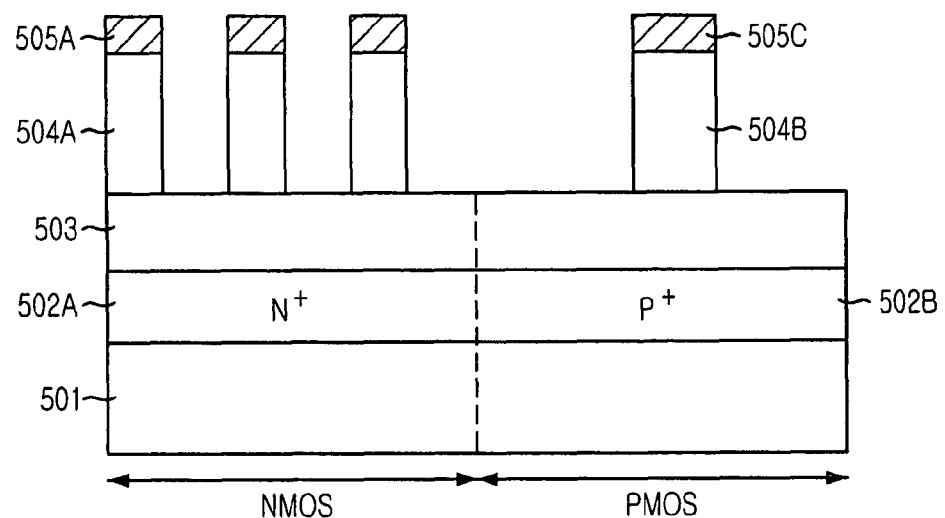

Referring to FIG. 5E, the second photoresist pattern 510 is removed. The second photoresist pattern 510 may be removed using oxygen plasma. A cleaning process is performed. The gate hard mask 504 is then etched. Reference numerals 504A and 504B refer to a first gate hard mask pattern 504A in the NMOS region and a second gate hard mask pattern 504B in the PMOS region, respectively.

Figure 5F:
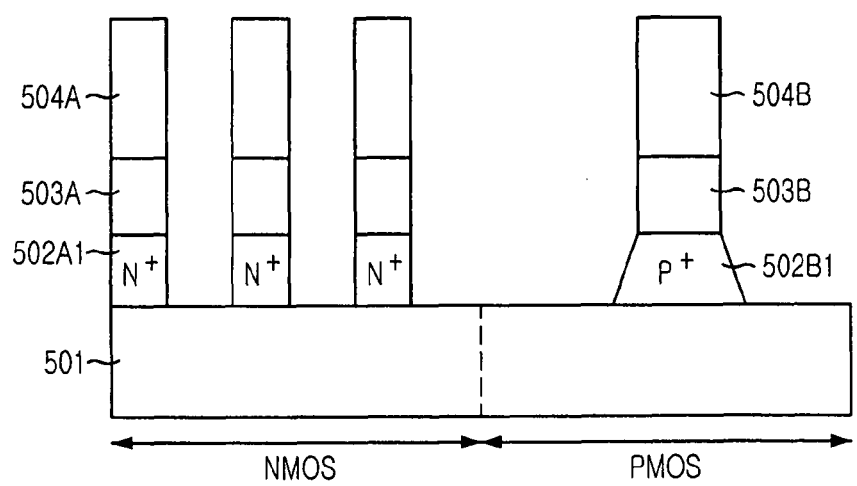

Referring to FIG. 5F, the metal electrode 503, the N-type polysilicon layer 502A, and the P-type polysilicon layer 502B are etched to form gate patterns. Hereinafter, portions of the metal electrode 503 remaining in the NMOS region are referred to as a first metal electrode pattern 503A and a portion of the metal electrode 503 remaining in the PMOS region is referred to as a second metal electrode pattern 503B. Reference numerals 502A1 and 502B1 refer to an N-type polysilicon pattern 502A1 and a P-type polysilicon pattern 502B1, respectively.

Even if the P-type polysilicon pattern 502B1 is formed with a positive slope, a bias increase is not large because the CD is reduced by trimming the second buffer pattern 505B as shown in FIG. 5D before etching the gate hard mask 504.

The first buffer pattern 505A and the trimmed second buffer pattern 505C may be removed by the time the gate patterns are formed, or may be removed after etching the gate hard mask 504 and before etching the metal electrode 503.

In accordance with the embodiments of the present invention, the CD of the peripheral region, which increases due to the pattern density difference between the cell region and the peripheral region, may be controlled by additionally forming the photoresist pattern and trimming the hard mask in the peripheral region such that the CDs between the cell region and the peripheral region are controlled.

Furthermore, the CD of the PMOS region may be controlled during the formation of the gate patterns in the NMOS and PMOS regions by forming the photoresist pattern which exposes the PMOS region where the bias increases due to the P-type polysilicon layer and performing the trimming process.

Also, the CD of the PMOS region may be sufficiently controlled through the simple mask process by trimming the gate hard mask or performing the trimming process after additionally forming the buffer layer to control the CD and form the gate patterns.

Moreover, the bias increase is not large even if the P-type polysilicon layer in the PMOS region is etched to have a positive slope by selectively controlling the CD in the PMOS region.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an etch target layer over a substrate including a cell region and a peripheral region;
    forming a first mask pattern having a first portion and a second portion over the etch target layer in the cell region and forming a second mask pattern having a first portion and a second portion over the etch target layer in the peripheral region;
    forming a photoresist pattern over only the cell region;
    trimming the first portion of the second mask pattern;
    removing the photoresist pattern and the second portion of the first mask pattern and the second portion of the second mask pattern at substantially the same time using an oxygen removal process; and
    etching the etch target layer to form a pattern in the cell region and a pattern in the peripheral region.

2. The method of claim 1, wherein forming the first mask pattern and the second mask pattern comprises:
    forming a first mask layer over the etch target layer;
    forming a second mask layer over the first mask layer;
    etching the second mask layer to form the second portion of the first mask pattern and the second portion of the second mask pattern; and
    etching the first mask layer to form the first portion of the first mask pattern and the first portion of the second mask pattern.

3. The method of claim 2, wherein the first mask layer comprises a nitride-based layer.

4. The method of claim 3, wherein the first mask layer comprises silicon nitride.

5. The method of claim 4, wherein trimming the first portion of the second mask pattern comprises performing a plasma etch process.

6. The method of claim 5, wherein performing the plasma etch process comprises using a gas including tetrafluoromethane ($CF_4$), trifluoromethane ($CHF_3$), and oxygen ($O_2$).

7. The method of claim 1, wherein the etch target layer comprises a conductive layer.

8. The method of claim 7, wherein the conductive layer comprises polysilicon, metal, or metal silicide.

9. The method of claim 1, wherein the patterns in the cell region and the peripheral region comprise a gate pattern or a bit line pattern.

* * * * *